United States Patent [19]
Shi et al.

[11] Patent Number: 5,626,971
[45] Date of Patent: May 6, 1997

[54] THIN FILM PROBE

[76] Inventors: Shei-Kung Shi, 6007 Porto Alegre Dr., San Jose, Calif. 95120; Fu-Hsiang Iseng, 19961 Buckhaven La., Saratoga, Calif. 95070; Chong-Kai Kuo, 3582 Pleasant Echo Dr., San Jose, Calif. 95148

[21] Appl. No.: 427,268

[22] Filed: Apr. 24, 1995

Related U.S. Application Data

[62] Division of Ser. No. 365,135, Dec. 28, 1994.

[51] Int. Cl.⁶ .................... H01L 21/66; G01R 31/26
[52] U.S. Cl. .................... 428/620; 428/622; 428/623; 324/754; 324/755; 324/757
[58] Field of Search .................. 428/620, 621, 428/627, 632, 626, 622, 630, 666, 674, 643, 672, 642; 324/754, 755, 757

[56] References Cited

U.S. PATENT DOCUMENTS

| | | | |
|---|---|---|---|
| 3,382,632 | 5/1968 | Ardezzone | 324/158 P |
| 4,963,225 | 10/1990 | Lehman-Lamer | 324/754 |
| 5,091,769 | 2/1992 | Eichelberger | 357/72 |
| 5,123,850 | 6/1992 | Elder et al. | 439/67 |
| 5,262,718 | 11/1993 | Svendsen et al. | 324/754 |
| 5,374,893 | 12/1994 | Koopman et al. | 324/754 |
| 5,406,210 | 4/1995 | Pedder | 324/757 |
| 5,440,239 | 8/1995 | Zappella et al. | 324/757 |

FOREIGN PATENT DOCUMENTS

| | | | |
|---|---|---|---|
| 280180A1 | 6/1990 | Germany | 324/757 |
| 1-150861 | 6/1989 | Japan | 324/757 |
| 5-164783 | 6/1993 | Japan | 324/754 |
| 6-230034 | 8/1994 | Japan | 324/754 |

*Primary Examiner*—John Zimmerman
*Attorney, Agent, or Firm*—Bacon & Thomas

[57] ABSTRACT

The present invention relates to a multichip module comprising one or more thin film probes. The thin film probes are useful in in situ probe testing of IC chips. An assembly comprising the multichip module and a circuit board having IC chips in a number corresponding to the number of thin film probes is also claimed.

6 Claims, 3 Drawing Sheets

5,626,971

THIN FILM PROBE

This application is a Division of application Ser. No. 08/365,135, filed Dec. 28, 1994, currently pending.

BACKGROUND OF THE INVENTION

1. Field of the Invention

The invention relates to the fabrication of an improved thin film probe for use in a multichip module (MCM) having improved test reliability and having the capability of in-situ testing and assembly.

2. Description of the Prior Art

Two of the key factors that limit the rapid growth of MCM technology have been the high cost and the availability of bare die that have the same quality and reliability as packaged devices. The present thin film probe is designed and fabricated to improve these two factors. It can economically test and characterize IC chips both in wafer form and as bare die prior to packaging. The thin film probe is able to produce Known Good Die (KGD), which is crucial to the wide adoption of advanced technology such as multichip module (MCM) and Chip on Board (COB).

In traditional MCM processes, before testing of the IC chips, all the IC chips are assembled on the substrate. If one chip fails during testing, the whole substrate is discarded. Costs are thus expensive and it takes a lot of time to replace the bad IC chips which are soldered on the substrate. Therefore, the manufacturing cost is increased in the prior processes. It is thus necessary to propose a novel probe and method of MCM fabrication to improve the test reliability and reduce the manufacturing costs of MCMs.

SUMMARY OF THE INVENTION

An objective of the invention is to provide a novel probe for use in place of the traditional metal probes. Reduction of capacitance and inductance by this thin film probe improves the test reliability.

Another objective of the invention is to provide a novel probe to be used as a chip carrier. This chip carrier works as a temporary IC package and is able to produce Known Good Die (KGD).

A further objective of the invention is to provide a method of self-aligning a multichip module with the capability of in-situ probe testing and assembly. Manufacturing cost is reduced by this technique.

In accordance with the first and second objectives of the invention, the probe is a thin film probe. The process is based on thin film technology fabricated on transparent or non-transparent material. The probe is made of a soft material on the bottom and a single tip head or multiple tip heads formed from a hard conducting material such as W, TiW or Nickel alloys on the top.

In accordance with the third objective of the invention, the high reliability MCM substrate is fabricated by a silicon wafer process. The topmost layer on the MCM base comprises tip heads which are made of a hard material with a solder material underneath. The finished MCM base is attached to a MCM package or a circuit board. Pads of IC chips are then placed and self-aligned to the thin film probe of the MCM base. The IC chips are pressed against the substrate by a fixed torque. If the tests pass, the solder is heated and the pads of the IC chips are bonded to the MCM base.

BRIEF DESCRIPTION OF THE DRAWINGS

The invention itself as well as other features and advantages thereof will be best understood by reference to the detailed description which follows, read in conjunction with the accompanying drawings.

DESCRIPTION OF THE PREFERRED EMBODIMENT

Figure 1:
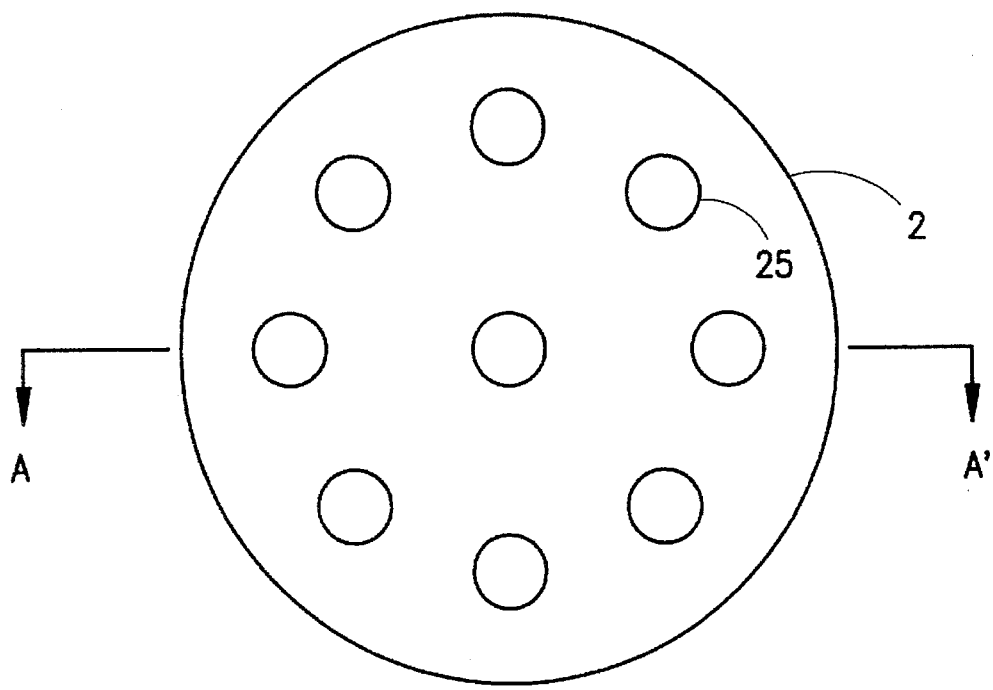
FIG. 1 is the top view of a thin film probe having tip heads according to the invention.
Figure 2A:
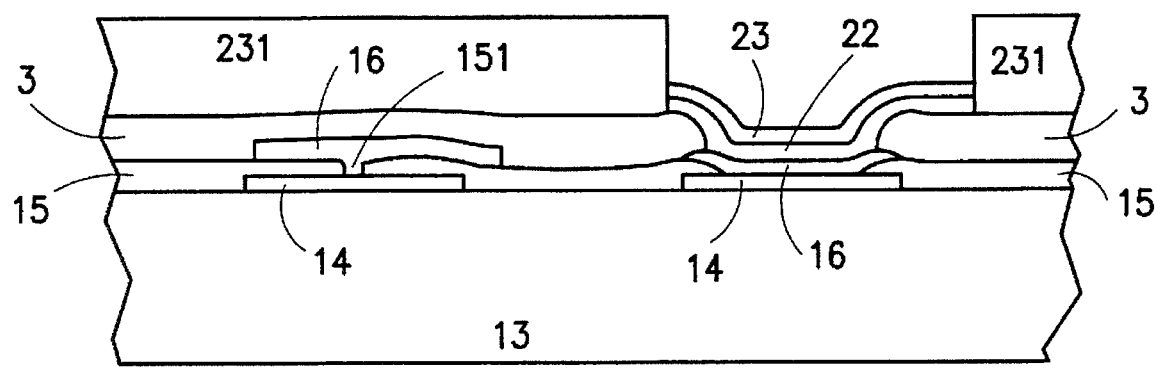
FIGS. 2A, 2B and 2C are cross-sectional views of crucial fabricating steps from the A–A' line of FIG. 1 and interconnecting metal layers near the thin film probe.
Figure 2B:
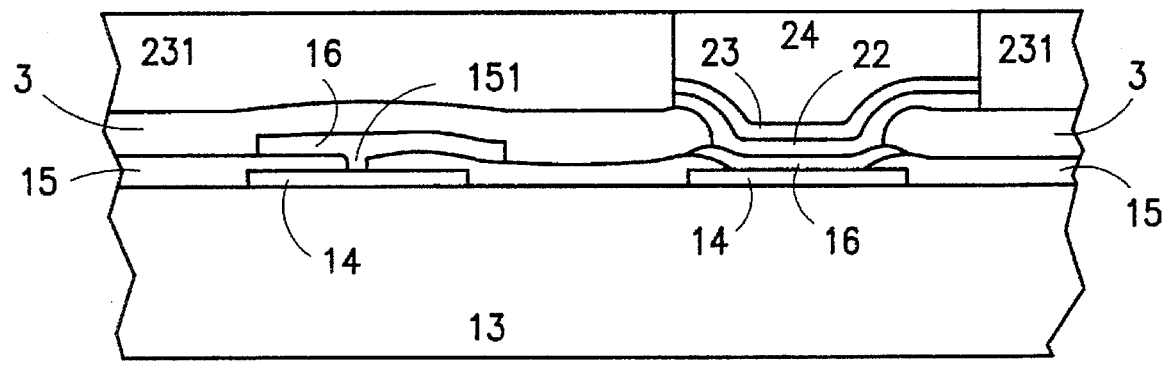
Figure 2C:
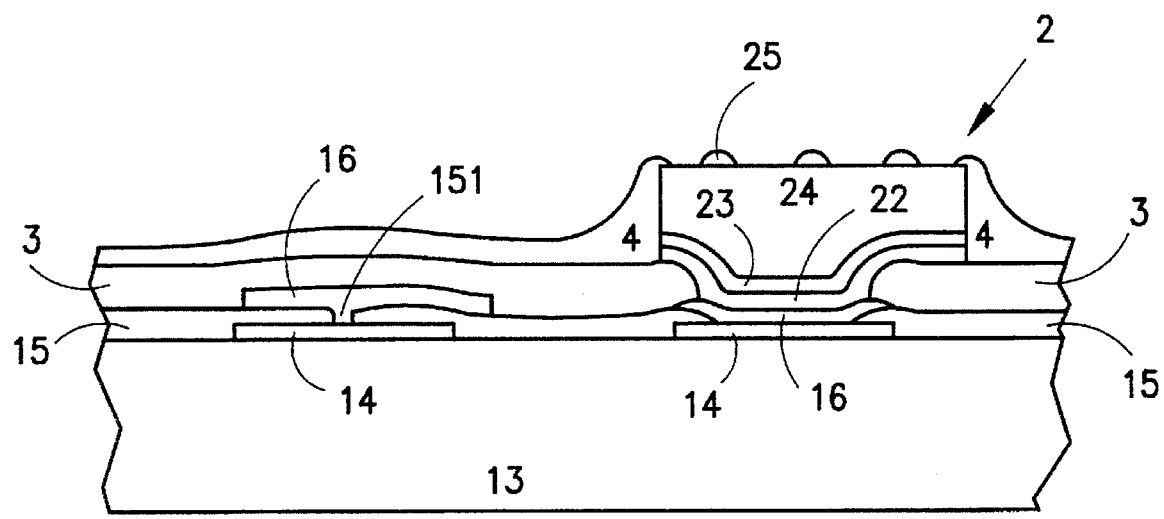

The invention of MCM fabrication substantially includes two processes—that is, the production of a multichip module base, and the assembly of IC chips and the multichip module base. The fabrication process of the multichip module base will be disclosed first. The number and the spatial location of thin film probes on the MCM base are a one to one correspondence to those pads of all IC chips to be utilized. FIG. 1 is the top view of a thin film probe 2 having nine tip heads 25. FIGS. 2A–2C are cross-sectional views of crucial fabricating steps from the A–A' line of FIG. 1 and some interconnecting metal layers near the thin film probe. The numeral 13 of FIG. 2 represents the substrate. The use of a transparent substrate can make the alignment between the thin film probe and the pads of the IC chips more feasible. The transparent material can be glass, quartz or epoxy, etc.

The MCM base of FIG. 2A is made of a substrate 13 on its bottom, a multimetal layer structure (14, 15, 16, 3) on its middle part, and thin film probe 2 on its top. The multimetal layers are used for signal lines, power, ground lines and planes. A first metal layer 14 is deposited on substrate 13 and subjected to a process of photolithography to form the desired pattern. Subsequently, an intermetal dielectric layer 15, a second metal layer 16 and a second intermetal dielectric layer 3 are deposited in this order and patterned by photomasking, developing and etching, as shown in FIG. 2A. The intermetal dielectric layer comprises oxide or polyimide. Some vias 151 are formed on the intermetal dielectric layer 15. This process is repeated until the desired layers of metal and dielectric are deposited and patterned. For simplicity, only two layers of metal 14, 16 and dielectric 15, 3 are shown in the figure. After the patterning of the last dielectric layer 3 is finished, a Cr film 22 and a Cu film 23 are then deposited in this order to a depth of 0.1 micrometer and 0.8 micrometer, respectively.

Subsequently, a polyimide 231 is coated on the whole surface of the substrate to a thickness of 10 micrometers. By use of photomasking and developing, recesses are formed which define the intended position of thin film probe 2 as shown in FIG. 2A. The diameter of the recesses is generally about 40 micrometers. Thereafter, a step of electroplating follows to fill the recesses with low hardness solder material 24, such as Pb/Sn, Au, Au/In and other alloys of Au. The solder material has two functions. One is to be used as a cushion or spring during scrubbing of the high hardness tip heads to bonding pads; the other is used as the solder material to ultimately bond the IC chips to the MCM base. The substrate is then heated to about 200° C. and the solder material melts to form a spherical shape. A mechanical polishing step polishes the polyimide 231 and solder 24 simultaneously to a depth of about 8 micrometers, thereby flattening the topography of MCM base as shown in FIG. 2B. The polyimide 231 is removed and the substrate is then subjected to deposition of a high hardness conducting material such as W, TiW or Ni alloy to a depth of 1 micrometer. The tip heads 25 are formed by finishing photoresist masking, exposing and etching the high hardness conducting material. For example, in FIG. 1 the thin film probe 2 has nine round tip heads 25. The high hardness of tip heads 25 is used to penetrate native aluminum oxide on the aluminum layer of the bonding pads of the IC chips. Finally, the photoresist is removed and nitride is deposited as a passivation layer 4, making only probe 2 exposed as shown in FIG. 2C.

Figure 3:
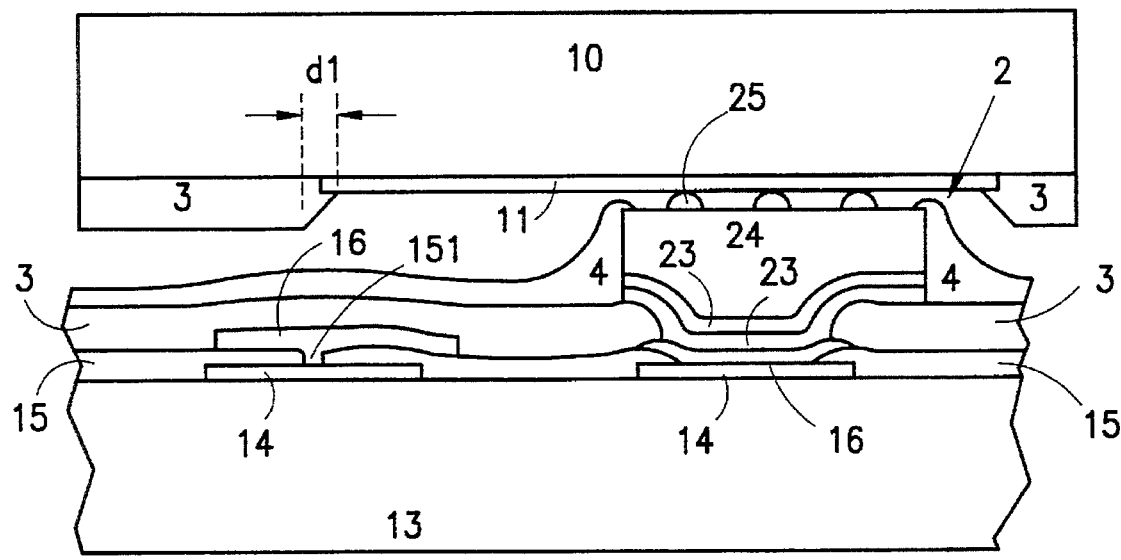
FIG. 3 is a schematic cross-sectional view of self-alignment between the multichip module base and the bonding pads of the IC chips.
Figure 4:
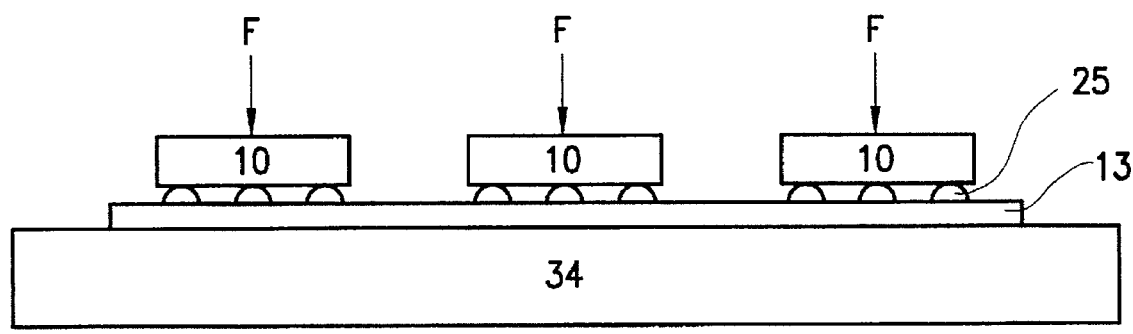
FIG. 4 is a schematic cross-sectional assembly view of IC chips and a multichip module base with the thin film probe situated therebetween.

Finally, MCM bases are attached to packages or circuit boards 34. Wire bonding between MCM bases and packages or circuit boards 34 are done before in situ testing and assembling. Each IC chip is then aligned and placed on the MCM base. Generally speaking, the area of bonding pads 11 is the square of 76 micrometers, and the diameter of thin film probe 2 is about 40 micrometers. Therefore, the misalignment tolerance between bonding pads 11 and thin film probe 2 is calculated as half of 76 micrometers subtracting 40 micrometers and results in 18 micrometers. Current placement systems can achieve this accuracy. Moreover, any misalignment of tip heads 25 touching at the rim of pads 11 could be automatically corrected by pressing the backside of IC chips 10 with fixed torque. Therefore, the tip heads 25 will either directly fall inside the bonding pad openings or move along the passivation layer near the rim of bonding pads 11 and touch the aluminum layer eventually as shown in FIG. 3. The aligning steps repeat until all of the IC chips are self-aligned and pressed with fixed torque F as shown in FIG. 4. Subsequently, the testing of the whole MCM proceeds. If the tests are positive, the solder 24 is heated to about 200° C., bonding pads 11 of IC chips 10 to the MCM base, and the whole MCM fabrication is finished. Generally used substrates can tolerate such temperatures.

Some distinguishing features of the invention can be found when compared with traditional art:

(1) The present MCM probing test and assembly can be performed under in-situ conditions, while in the traditional art, all IC chips have to be assembled before testing. The present process is thereby simplified and the production cycle time is reduced. Moreover, the replacing of failed chips is feasible and inexpensive. Therefore, the invention can save the huge cost loss of MCM failure.

(2) The misalignment tolerance between bonding pads and thin film probe increases and thereby makes the process more stable, and more controllable. The nontransparent, nonconductive material such as a wafer, or the backside of LCD, can also be used as the MCM substrate in the invention due to also have large misalignment tolerance.

Although the preferred embodiment of the invention has been disclosed for illustrative purposes, those skilled in the art will appreciate that various modifications, additions and substitutions are possible, without departing from the scope and spirit of the invention, as disclosed in the accompanying claims.

We claim:

1. A thin film probe device comprising:

a substrate which comprises a non-conducting material;

a stacked structure of patterned multiple metal layers and multiple intermetal dielectric layers deposited on the substrate;

a Cr film deposited on part of said stacked structure;

a Cu film deposited on the Cr film;

a patterned soft conducting solder material deposited on the Cu film to position the thin film probe;

several round tip heads comprising hard conducting material formed on top of said soft conducting solder material;

a passivation layer covering the whole surface of the device, exposing only the thin film probe.

2. The device according to claim 1 wherein the non-conducting material is selected from the group consisting of glass, quartz and epoxy.

3. The device according to claim 1 wherein the metal layers are comprised of AlCu and the intermetal dielectric layers are comprised of oxides or polyimides.

4. The device according to claim 1 wherein the soft conducting solder material is selected from the group consisting of Pb/Sn, Au and Au/In.

5. The device according to claim 1 wherein the hard conducting material is selected from the group consisting of TiW and alloys of Ni and W.

6. The device according to claim 1 wherein the soft conducting solder material is an alloy of Au.

\* \* \* \* \*